(12) United States Patent
Hsu et al.

(10) Patent No.: US 10,748,831 B2
(45) Date of Patent: Aug. 18, 2020

(54) SEMICONDUCTOR PACKAGES HAVING THERMAL THROUGH VIAS (TTV)

(71) Applicant: Taiwan Semiconductor Manufacturing Co., Ltd., Hsinchu (TW)

(72) Inventors: Sen-Kuei Hsu, Kaohsiung (TW); Ching-Feng Yang, Taipei (TW); Hsin-Yu Pan, Taipei (TW); Kai-Chiang Wu, Hsinchu (TW); Yi-Che Chiang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/992,196

(22) Filed: May 30, 2018

(65) Prior Publication Data

US 2019/0371694 A1    Dec. 5, 2019

(51) Int. Cl.
| | |
|---|---|
| *H01L 23/36* | (2006.01) |
| *H01L 23/52* | (2006.01) |
| *H01L 23/538* | (2006.01) |
| *H01L 23/367* | (2006.01) |
| *H01L 23/00* | (2006.01) |
| *H01L 21/768* | (2006.01) |
| *H01L 23/522* | (2006.01) |

(52) U.S. Cl.
CPC ...... *H01L 23/367* (2013.01); *H01L 21/76816* (2013.01); *H01L 23/5226* (2013.01); *H01L 23/5384* (2013.01); *H01L 23/562* (2013.01); *H01L 24/17* (2013.01); *H01L 24/32* (2013.01); *H01L 2224/02379* (2013.01)

(58) Field of Classification Search
CPC ............ H01L 23/367; H01L 23/5226; H01L 23/5384; H01L 23/562; H01L 24/17; H01L 24/32
See application file for complete search history.

(56) References Cited

U.S. PATENT DOCUMENTS

| | | | | |
|---|---|---|---|---|
| 7,514,335 | B2 * | 4/2009 | Wakabayashi | H01L 21/568 438/411 |
| 7,525,237 | B2 * | 4/2009 | Sugiura | B06B 1/0629 310/322 |
| 8,101,868 | B2 * | 1/2012 | Ito | H01L 23/5385 174/260 |
| 8,193,604 | B2 * | 6/2012 | Lin | H01L 23/49816 257/531 |
| 8,343,810 | B2 * | 1/2013 | Oh | H05K 1/186 257/E23.136 |
| 8,384,227 | B2 * | 2/2013 | Cho | H01L 21/56 257/778 |

(Continued)

*Primary Examiner* — Ida M Soward
(74) *Attorney, Agent, or Firm* — JCIPRNET

(57) ABSTRACT

Semiconductor packages and methods of forming the same are provided. One of the semiconductor package includes a first die, a dummy die, a first redistribution layer structure, an insulating layer and an insulating layer. The dummy die is disposed aside the first die. The first redistribution layer structure is electrically connected to the first die and having connectors thereover. The insulating layer is disposed over the first die and the dummy die and opposite to the first redistribution layer structure. The insulating layer penetrates through the insulating layer.

20 Claims, 15 Drawing Sheets

(56) References Cited

U.S. PATENT DOCUMENTS

| | | | |
|---|---|---|---|
| 8,445,323 B2* | 5/2013 | Lin | H01L 23/49816 |
| | | | 438/109 |
| 8,993,380 B2 | 3/2015 | Hou et al. | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2* | 6/2015 | Hung | H01L 21/561 |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,583,436 B2* | 2/2017 | Tseng | H01L 24/00 |
| 9,591,767 B2* | 3/2017 | Itoi | H01L 23/367 |
| 9,666,502 B2 | 5/2017 | Chen et al. | |
| 9,735,131 B2 | 8/2017 | Su et al. | |
| 9,831,170 B2* | 11/2017 | Scanlan | H01L 23/49838 |
| 9,911,672 B1* | 3/2018 | Wu | H01L 25/105 |
| 10,483,443 B2* | 11/2019 | Maki | H01L 25/0753 |
| 2011/0157763 A1* | 6/2011 | Yamamoto | H01G 4/232 |
| | | | 361/301.4 |
| 2015/0357274 A1* | 12/2015 | Choi | H01L 21/561 |
| | | | 257/737 |
| 2016/0079133 A1* | 3/2016 | Nashida | H01L 24/01 |
| | | | 257/690 |
| 2017/0148755 A1* | 5/2017 | Scanlan | H01L 24/19 |
| 2017/0373038 A1* | 12/2017 | Lin | H01L 25/50 |
| 2018/0076142 A1* | 3/2018 | Shim | H01L 23/5389 |
| 2018/0331041 A1* | 11/2018 | Liao | H01L 23/49822 |
| 2019/0067001 A1* | 2/2019 | Chen | H01L 21/78 |
| 2019/0348747 A1* | 11/2019 | Liu | H01Q 1/38 |

* cited by examiner

SEMICONDUCTOR PACKAGES HAVING THERMAL THROUGH VIAS (TTV)

BACKGROUND

In the packaging of integrated circuits, semiconductor dies may be packaged by a molding compound, and may be bonded to other package components such as interposers and package substrates. Heat dissipation is a challenge in the semiconductor packages. There exists a bottleneck in efficiently dissipating the heat generated in the inner dies of the semiconductor packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
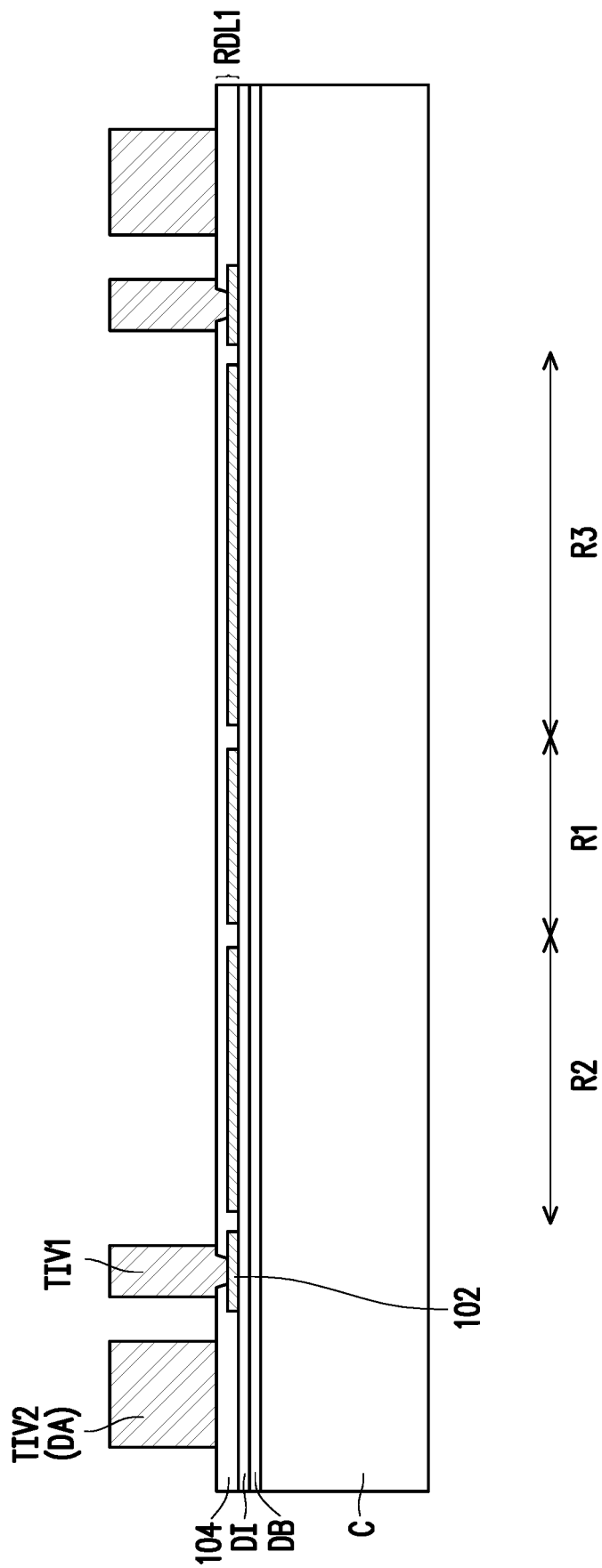
FIG. 1A to FIG. 1F are cross-sectional views of a method of forming a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
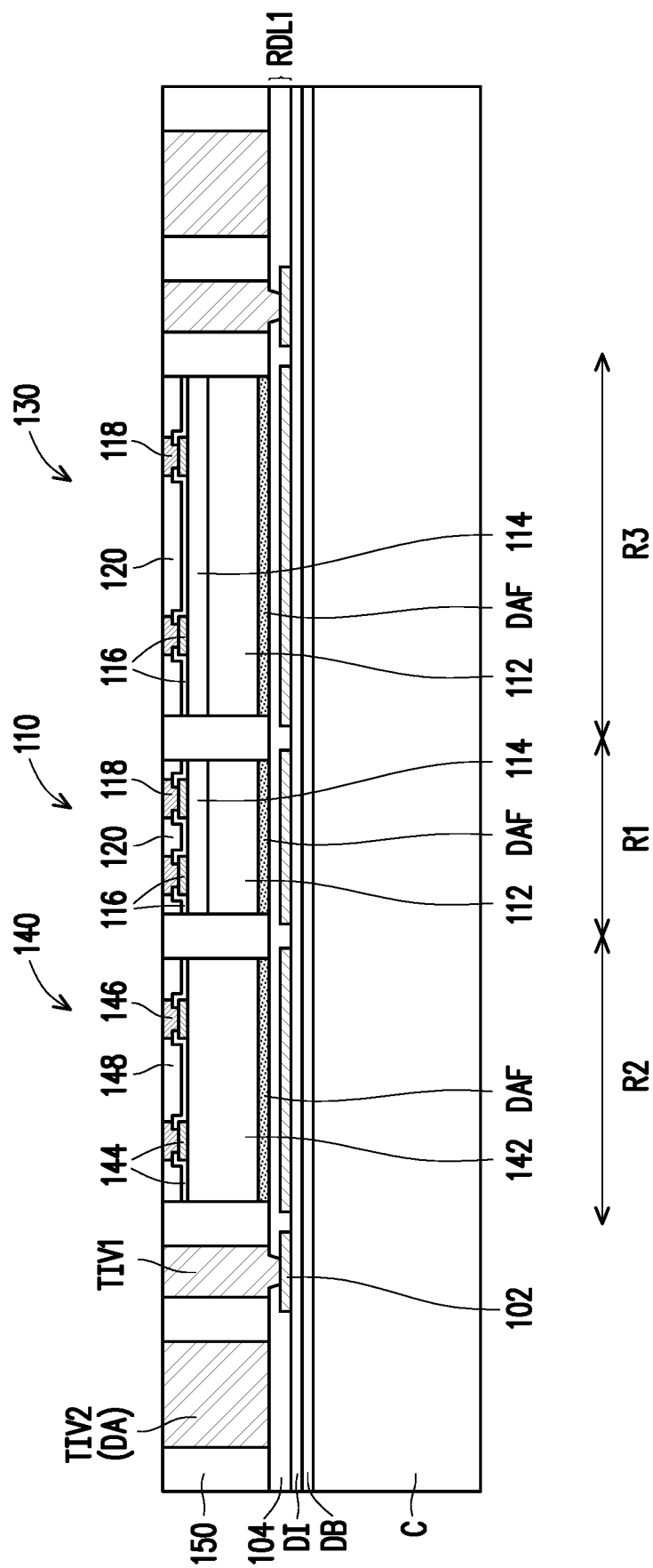
Figure 1C:
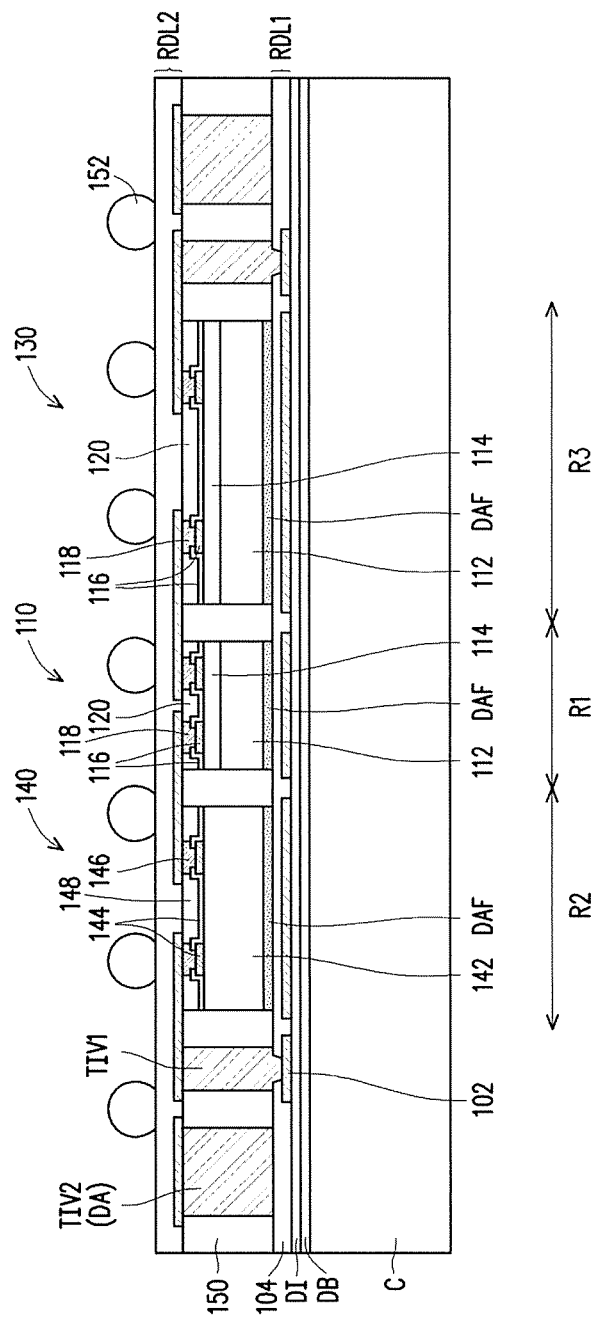
Figure 1D:
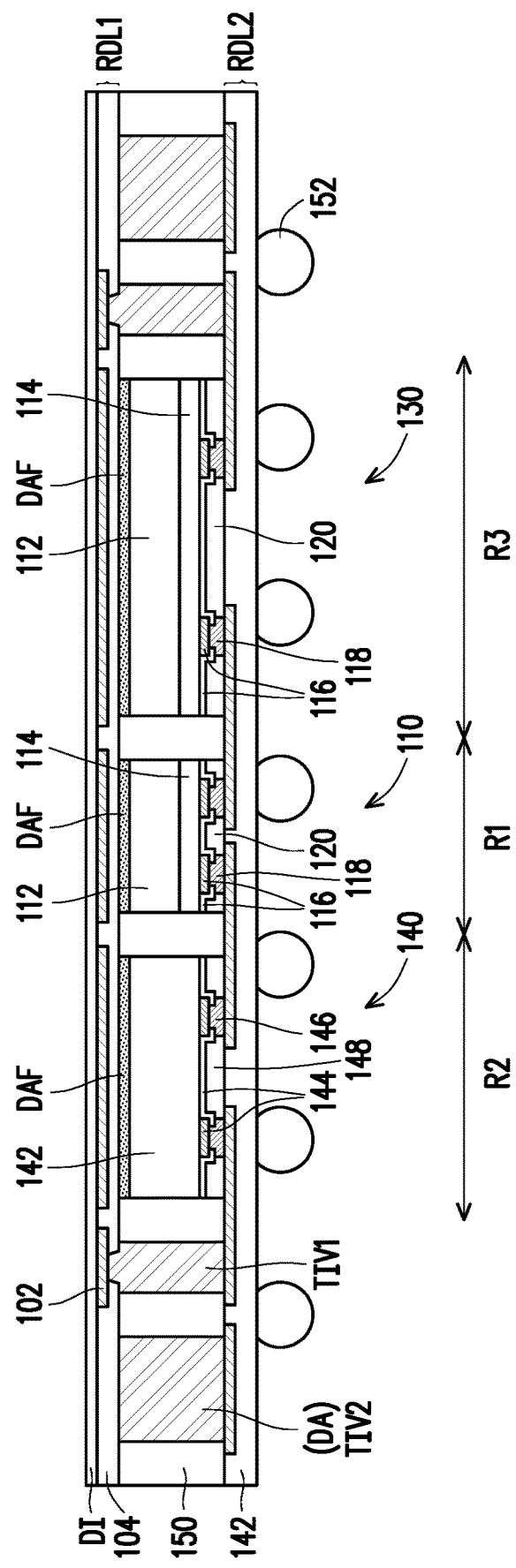
Figure 1E:
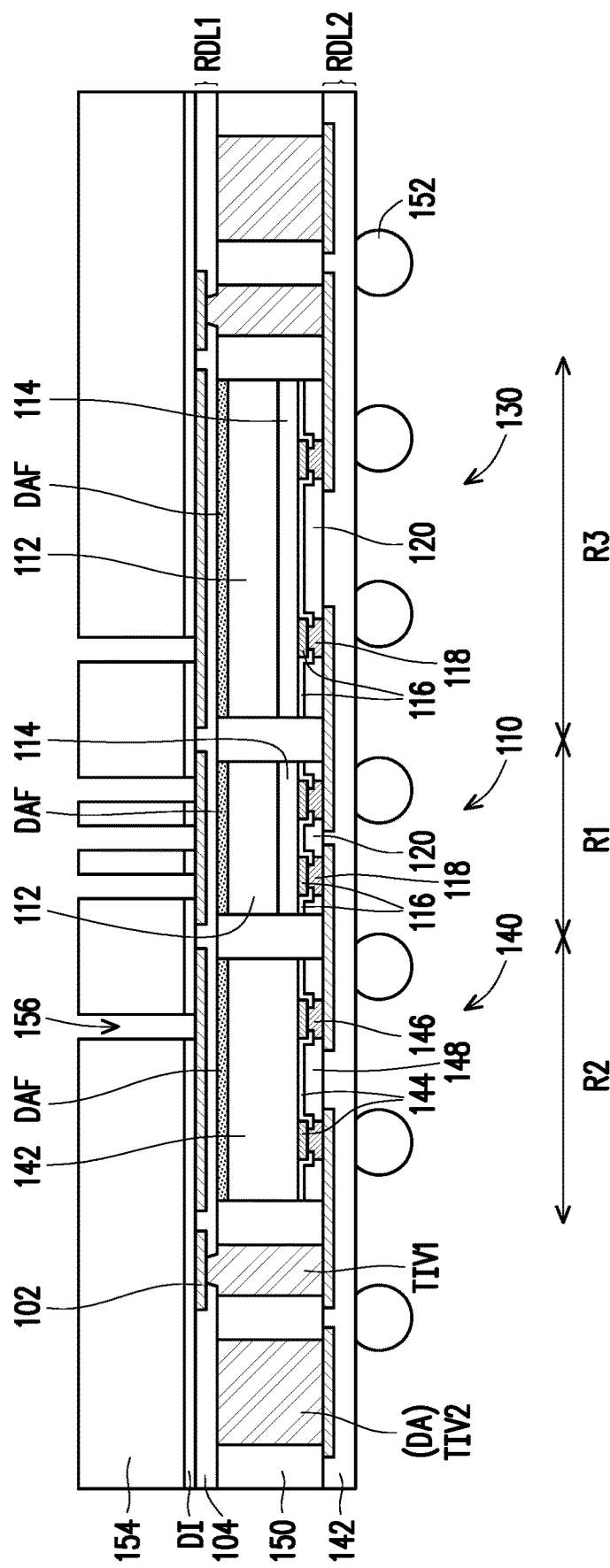
Figure 1F:
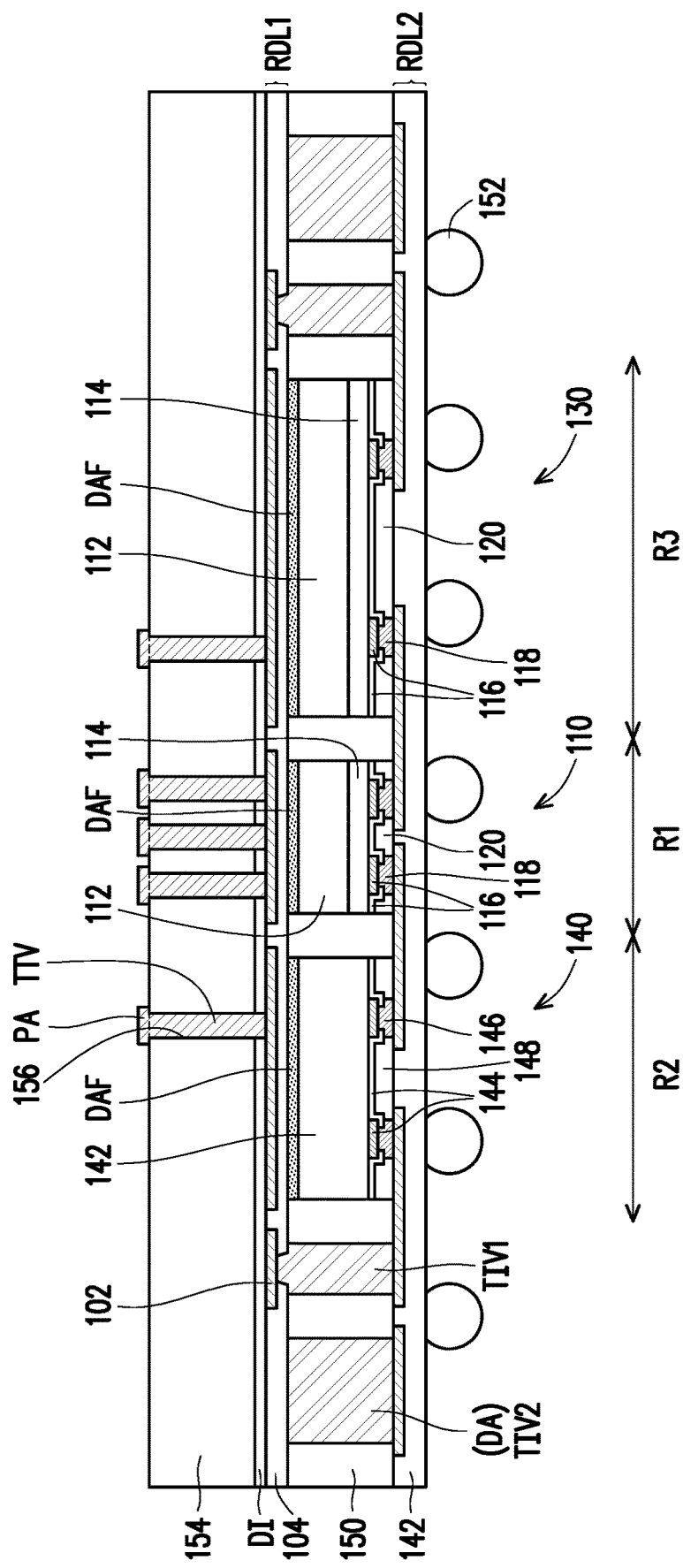
Figure 2:
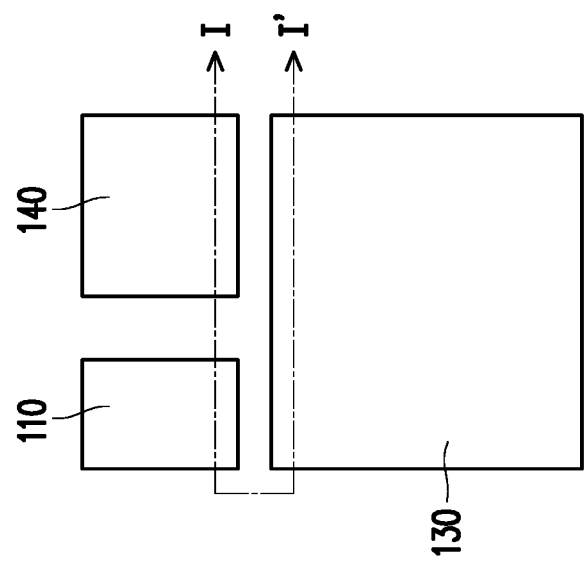
FIG. 2 is a schematic top view illustrating a semiconductor package in accordance with some embodiments.

FIG. 1A to FIG. 1F are cross-sectional views of a method of forming a semiconductor package in accordance with some embodiments. FIG. 1F is a simplified top view taken along the line I-I of FIG. 2. For simplicity and clarity of illustration, only few elements such as first die, second die and dummy die are shown in the simplified top view of FIG. 2. In some embodiments, the semiconductor package is an integrated fan-out package, for example.

Referring to FIG. 1A, a carrier C is provided with a de-bonding layer DB and a dielectric layer DI formed thereon, and the de-bonding layer DB is between the carrier C and the dielectric layer DI. In some embodiments, the carrier C is a glass substrate, the de-bonding layer DB is a light-to-heat conversion (LTHC) release layer, and the dielectric layer DI is a polymer layer such as polybenzoxazole (PBO), polyimide (PI), benzocyclobutene (BCB), a combination thereof or the like.

Thereafter, a first redistribution layer structure RDL1 is formed on the dielectric layer DI. The first redistribution layer structure RDL1 is referred to as a "backside redistribution layer structure" through the specification. Specifically, the first redistribution layer structure RDL1 includes redistribution layers 102 and dielectric layers 104 stacked alternately. In some embodiments, the redistribution layer 102 includes copper, nickel, titanium, a combination thereof, or the like. In some embodiments, the dielectric layer 104 includes a photo-sensitive material such as polybenzoxazole (PBO), polyimide (PI), benzocyclobutene (BCB), a combination thereof or the like. In alternative embodiments, more redistribution layers and dielectric layers can be included in the first redistribution layer structure RDL1, and the dielectric layers and the redistribution layers are stacked alternately. The number of the dielectric layers or redistribution layers is not limited by the present disclosure.

A plurality of through integrated fan-out vias TIV1 and TIV2 are formed on the first redistribution layer structure RDL1. In some embodiments, the through integrated fan-out vias TIV1 penetrate through the dielectric layer 104 and are electrically connected to the redistribution layer 102, and the through integrated fan-out vias TIV2 are formed on the dielectric layer 104. In some embodiments, the through integrated fan-out vias TIV2 are arranged to form a plurality of dipole antennas DA. Specifically, the dipole antennas DA are formed during the formation of the through integrated fan-out vias.

In some embodiments, the method of forming the through integrated fan-out vias TIV1 and TIV2 includes the following operations. A seed material layer (not shown) is formed over the first redistribution layer structure RDL1. In some embodiments, the seed material layer includes a titanium/copper composite layer, and is formed by a sputtering process. Thereafter, a photoresist layer (not shown) with openings is formed on the seed material layer, and the openings of the photoresist layer expose the intended locations for the subsequently formed through integrated fan-out vias. Afterwards, a plating process is performed to form a metal material layer (e.g., a copper layer) on the seed material layer exposed by the openings of the photoresist layer. The photoresist layer and the underlying seed material layer are then removed to form the through integrated fan-out vias TIV1 and TIV2.

In some embodiments, the through integrated fan-out vias TIV2 or dipole antennas DA have a dimension (e.g., width) greater than that of the through integrated fan-out vias TIV1. However, the present disclosure is not limited thereto. In alternative embodiments, the through integrated fan-out vias TIV2 or dipole antennas DA have a dimension (e.g., width) substantially equal to or less than that of the through integrated fan-out vias TIV1. In some embodiments, the frequency band of the dipole antenna DA is 60 GHz, for example.

Referring to FIG. 1B, after the through integrated fan-out vias TIV1 and TIV2 are formed, a first die 110, a second die 130 and a dummy die 140 and are picked and placed on the carrier C. In some embodiments, the first die 110, the second die 130 and the dummy die 140 are attached to the dielectric layer DI with a die attach film DAF therebetween. In some embodiments, the first die 110 is formed in a first region R1, the dummy die 140 is formed in a second region R2, and the second die 130 is formed in a third region R3, for example. The first die 110 is a high-power consuming die or die stack, and the second die 130 is a low-power consuming die or stack. The first die 110 is a high-power consuming die and may consume a relatively high amount of power, and hence generate a relatively large amount of heat, compared to the second die 130 which is a low-power consuming die. In some embodiments, the first die 110 is a power chip, and the second die 130 is a radio frequency (RF) die, for example. In some embodiments, the first die 110 and the second die die 130 include a substrate 112, a device layer 114 in or on the substrate 112, a conductive structure 116, die connectors 118 and a die insulating layer 120. The substrate 112 may be a semiconductor substrate, such as a silicon substrate, although it may be formed of other semiconductor materials including, and not limited to, silicon germanium, silicon carbon, gallium arsenide, or the like. The device layer 114 may be formed in or on the substrate 112. In some embodiments, the device layer 114 include transistors, resistors, capacitors, inductors, and/or the like. The conductive structure 116 may be formed on and electrically connected to the device layer 114 and may be an interconnect structure. The conductive structure 116 may include a plurality of dielectric layers (not shown), which may include an Inter-Layer Dielectric (ILD) and Inter-Metal Dielectrics (IMDs), and conductive layers and vias disposed in the dielectric layers. The die connectors 118 are formed over and electrically connected to underlying pads of conductive structure 116. The die connectors 118 include solder bumps, gold bumps, copper pillars or the like, and are formed with a ball drop process or an electroplating process. The die insulating layer 120 is formed over the substrate 112 and exposes portions of the die connectors 118. In some embodiments, the die insulating layer 120 is a polymer layer. For example, the die insulating layer 120 includes a photo-sensitive material such as polybenzoxazole (PBO), polyimide, benzocyclobutene (BCB), a combination thereof, or the like.

In some embodiments, the dummy die 140 is used to increase the thermal capacitance and decrease the junction temperature, in other words, the dummy die 140 does not provide substantial function and thus may be a device-free die. In some embodiments, the dummy die 140 does not have a device layer including transistors, resistors, capacitors, inductors, and/or the like. In some embodiments, the dummy die 140 includes a substrate 142, a conductive structure 144, dummy die connectors 146 and a dummy die insulating layer 148. The conductive structure 144 may be formed on and electrically connected to vias of the substrate 142 and may be an interconnect structure. The conductive structure 144 may include a plurality of dielectric layers (not shown), which may include an Inter-Layer Dielectric (ILD) and Inter-Metal Dielectrics (IMDs), and conductive layers and vias disposed in the dielectric layers. The substrate 142, the dummy die connectors 146 and the dummy die insulating layer 148 are similar to the substrate 112, the die connectors 118 and the die insulating layer 120, and thus their description is omitted herein. In some embodiments, a size of the dummy die 140 may be adjusted according to a power of the first die 110. In other words, the thermal capacitance may be increased by enlarge a size of the dummy die 140.

Conventionally, since sizes of the first die 110 and the second die 130 are different, the first die 110 and the second die 130 are arranged together to form a non-rotationally symmetrical shape, which may cause a warpage issue. In some embodiments, by providing the dummy die 140 with a designed shape and size, the dummy die 140 may be formed a rotationally symmetrical shape with the first die 110 and the second die 130. Thus, the warpage is prevented. It is note that the term "the rotationally symmetrical shape" means a shape substantially having rotational symmetry and a shape substantially composed of a shape of the bottom of the first die 110, a shape of the bottom of the second die 130, a shape of the bottom of the dummy die 140 and a shape of a gap therebetween. In some embodiments, the rotationally symmetrical shape is a rectangle or a regular polygon, for example. The sizes of the first die, the second die and the dummy die are not limited by the present disclosure.

Thereafter, a molding layer 150 is formed over the carrier C to encapsulate or surround the sidewalls of the through integrated fan-out vias TIV1 and TIV2 and the sidewalls of the first die 110, the second die 130 and the dummy die 140. In some embodiments, a mold with a mold cavity (not shown) is pressed against the first die 110, the second die 130 and the dummy die 140, and the molding cavity is then filled with a molding material to form the molding layer 150. In some embodiments, the molding layer 150 includes a molding compound, a molding underfill, a resin or the like, such as epoxy. In some embodiments, the molding layer 150 includes a photo-sensitive material such as polybenzoxazole (PBO), polyimide, benzocyclobutene (BCB), a combination thereof, or the like.

Referring to FIG. 1C, a second redistribution layer RDL2 is formed over the molding layer 150. The second redistribution layer structure RDL2 is referred to as a "front-side redistribution layer structure" through the specification. In some embodiments, the second redistribution layer structure RDL2 is electrically connected to the die connectors 118 of the first die 110 and the second die 130, the dummy die connectors 146 of the dummy die 140 and the through integrated fan-out vias TIV1 and TIV2. In some embodiments, the second redistribution layer structure RDL2 includes a plurality of dielectric layers and a plurality of redistribution layers stacked alternately. The number of the dielectric layers or redistribution layers is not limited by the disclosure. In some embodiments, the topmost redistribution layer is also called an under-ball metallurgy (UBM) layer for ball mount. In some embodiments, each of the dielectric layers includes a photo-sensitive material such as polybenzoxazole (PBO), polyimide, benzocyclobutene (BCB), a combination thereof, or the like. In some embodiments, each of the redistribution layers includes copper, nickel, titanium, a combination thereof, or the like, and is formed by an electroplating process. In some embodiments, the dummy die 140 is electrically connected to the first die 110 through the second redistribution layer structure RDL2, for example. In alternative embodiments, the dummy die 140 may be not electrically connected to the first die 110. In alternative embodiments, the dummy die 140 may be electrically floated.

Thereafter, connectors 152 such as balls or bumps are formed over and electrically connected to the second redistribution layer structure RDL2. In some embodiments, the connectors 152 are made of a conductive material with low resistivity, such as Sn, Pb, Ag, Cu, Ni, Bi or an alloy thereof, and are formed by a suitable process such as evaporation, plating, ball drop, or screen printing.

Referring to FIG. 1D, the carrier C is de-bonded. In some embodiments, the carrier C with the first die 110, the second die 130, the dummy die 140, the molding layer 150, the first and second redistribution layer structures RDL1 and RDL2 is turned over, the de-bonding layer DB is decomposed under heat of light, and the carrier C is then released from the backsides or first sides of the first die 110, the second die 130 and the dummy die 140.

Referring to FIG. 1E, an insulating layer 154 is formed over the backsides or first sides of the first die 110, the second die 130 and the dummy die 140. Specifically, the insulating layer 154 is formed on the dielectric layer DI. The first redistribution layer structure RDL1 and the thermal through vias TTV are disposed at opposite sides of the first die 110. In some embodiments, the insulating layer 154 is a polymer layer. For example, the insulating layer 154 includes a photo-sensitive material such as polybenzoxazole (PBO), polyimide, benzocyclobutene (BCB), a combination thereof, or the like. The insulating layer 154 is formed by a suitable fabrication technique such as spin-coating, lamination, deposition or the like. A thickness of the insulating layer 154 ranges from 110 µm to 400 µm, for example.

Then, a plurality of openings 156 are formed in the insulating layer 154. In some embodiments, the openings 156 are formed by a suitable fabrication technique such as laser drilling process, an etching process or the like.

Referring to FIG. 1F, a plurality of thermal through vias TTV are formed in the openings 156 of the insulating layer 154. In some embodiments, the thermal through vias TTV penetrate through the insulating layer 154 and are electrically connected to the first die 110 through the first redistribution layer structure RDL1, the through integrated fan-out vias TIV1 and the second redistribution layer structure RDL2, for example. In alternative embodiments, the thermal through vias TTV may be not electrically connected to the first die 110. In alternative embodiments, the thermal through vias TTV may be electrically floated. In some embodiments, the thermal through vias TTV are respectively formed above the first die 110 in the first region R1, the second die 130 in the third region R3 and the dummy die 140 in the second region R2, for example. Specifically, the thermal through vias TTV may be arranged in a row, a column or an array respectively in the first, second and third regions Ra, R2 and R3, for example. In some embodiments, the density of the thermal through vias TTV in the first region R1 is larger than the density of the thermal through vias TTV in other regions such as the second region R2 or the third region R3. In the case that the thermal through vias TTV have substantially the same size, the density of the thermal through vias TTV in the first region R1 is defined as the number of the thermal through vias TTV in the first region R1 divided by an area of the first region R1, the density of the thermal through vias TTV in the second region R2 is equal to the number of the thermal through vias TTV in the second region R2 divided by an area of the second region R2, and the density of the thermal through vias TTV in the third region R3 is equal to the number of the thermal through vias TTV in the third region R3 divided by an area of the third region R3. In some embodiments, the area of the first region R1 may be an area of a top surface of the first die 110, the area of the second region R2 may be an area of a top surface of the dummy die 140, and the area of the third region R2 may be an area of a top surface of the second die 130.

In alternative embodiments, the thermal through vias TTV may be mainly formed directly above the first die 110 in the first region R1, for example. In alternative embodiments, the thermal through vias TTV may be only formed in the first region R1, and not formed in other regions such as the second region R2, the third region R3 or the region above the through integrated fan-out vias TIV1 and TIV2, for example. However, the present disclosure is not limited thereto. In alternative embodiments, the thermal through vias TTV may be formed at other positions above the first die 110. In some embodiments, the thermal through vias TTV includes copper, nickel, titanium, a combination thereof, or the like. The thermal through vias TTV are formed by a suitable process such as evaporation, plating, or screen printing. The number, shapes, sizes, variations, configurations and distributions of the thermal through vias are not limited by the present disclosure. Rather, those parameters can be adjusted upon the design requirements.

In some embodiments, a plurality of patch antennas PA are disposed over the insulating layer 154 to electrically connect to thermal through vias TTV. Specifically, the patch antennas PA are at the backsides or first sides of the first die 110, the second die 130 and the dummy die 140. In some embodiments, the thermal through vias TTV and the patch antennas PA are formed integrally, for example. The patch antennas PA may be square, rectangular, polygonal, round, elliptical or any suitable shape.

In some embodiments, the dummy die and the thermal through vias are formed aside and above the first die, and thus the thermal capacitances are increased and the junction temperature is decreased. In other words, the dummy die and the thermal through vias provide another way for heat dissipation, the temperature of the first die may be significantly decreased. In addition, the dummy die may control the warpage to increase the process capability. Accordingly, the performance and the lifetime of the semiconductor package may be increased.

Possible modifications and alterations can be made to the semiconductor package. These modifications and alterations are provided for illustration purposes, and are not construed as limiting the present disclosure. FIG. 3A to FIG. 3F are cross-sectional views of a method of forming a semiconductor package in accordance with some embodiments.

Figure 3A:
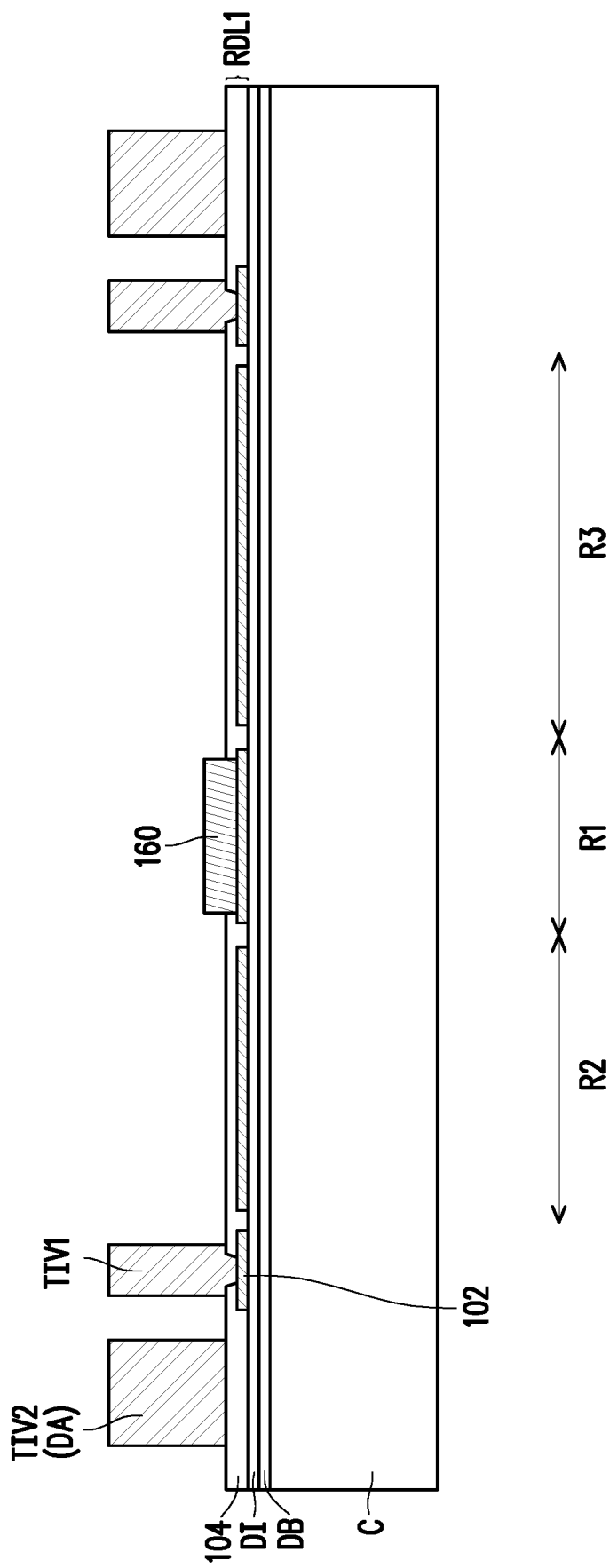
FIG. 3A to FIG. 3F are cross-sectional views of a method of forming a semiconductor package in accordance with some embodiments.

The method of FIG. 3A to FIG. 3F is similar to the method of FIG. 1A to FIG. 1F, and the difference between them is described below. Referring to FIG. 3A, a carrier C is provided with a de-bonding layer DB and a dielectric layer DI formed thereon, and the de-bonding layer DB is between the carrier C and the dielectric layer DI. Thereafter, a first redistribution layer structure RDL1 is formed on the dielectric layer DI. In some embodiments, a redistribution layer 102 of the first redistribution layer structure RDL1 in a first region R1 is exposed. A plurality of through integrated fan-out vias TIV1 and TIV2 are formed on the first redistribution layer structure RDL1. In some embodiments, the through integrated fan-out vias TIV2 are arranged to form a plurality of dipole antennas DA.

Then, a conductive paste 160 is formed on the redistribution layer 102 in the first region R1. In some embodiments, the conductive paste 160 is in direct contact with the redistribution layer 102 and partially embedded in a dielectric layer 104 aside the redistribution layer 102. The conductive paste 160 is a silver paste, for example.

Figure 3B:
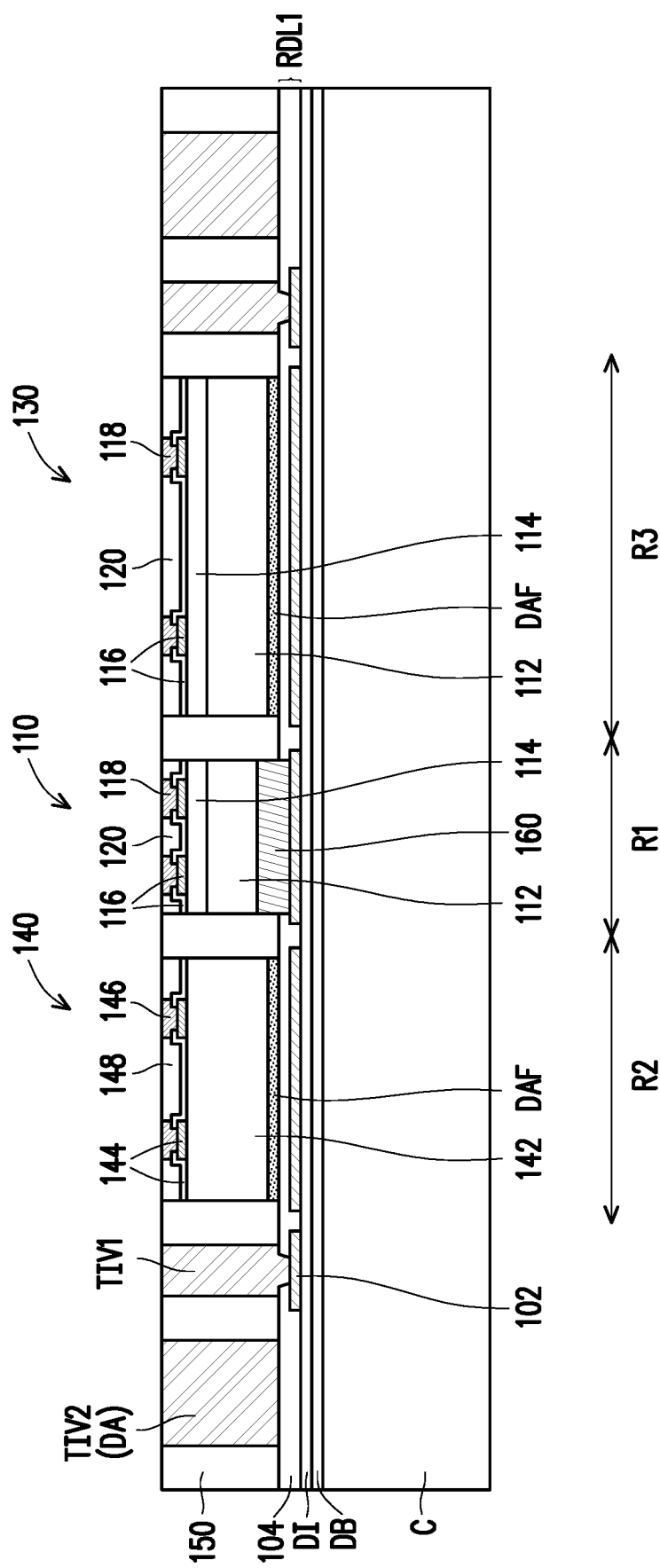

Referring to FIG. 3B, a first die 110, a second die 130 and a dummy die 140 and are picked and placed on the carrier C. In some embodiments, the first die 110 is directly placed on the conductive paste 160 in the first region R1, while the second die 130 and the dummy die 140 are attached to the dielectric layer DI with a die attach film DAF therebetween.

Thereafter, a molding layer 150 is formed over the carrier C to encapsulate or surround the sidewalls of the through integrated fan-out vias TIV1 and TIV2, the sidewalls of the conductive paste 160 and the sidewalls of the first die 110, the second die 130 and the dummy die 140.

Figure 3C:
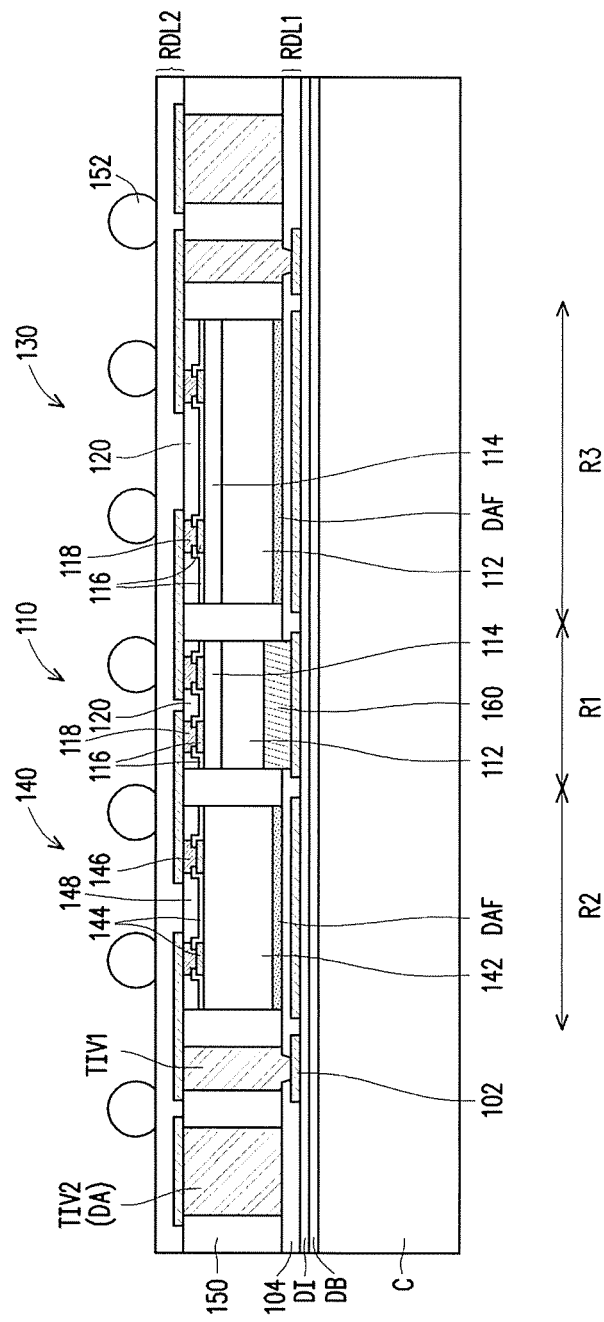

Referring to FIG. 3C, a second redistribution layer RDL2 is formed over the molding layer 150. Thereafter, connectors 152 such as balls or bumps are formed over and electrically connected to the second redistribution layer structure RDL2.

Figure 3D:
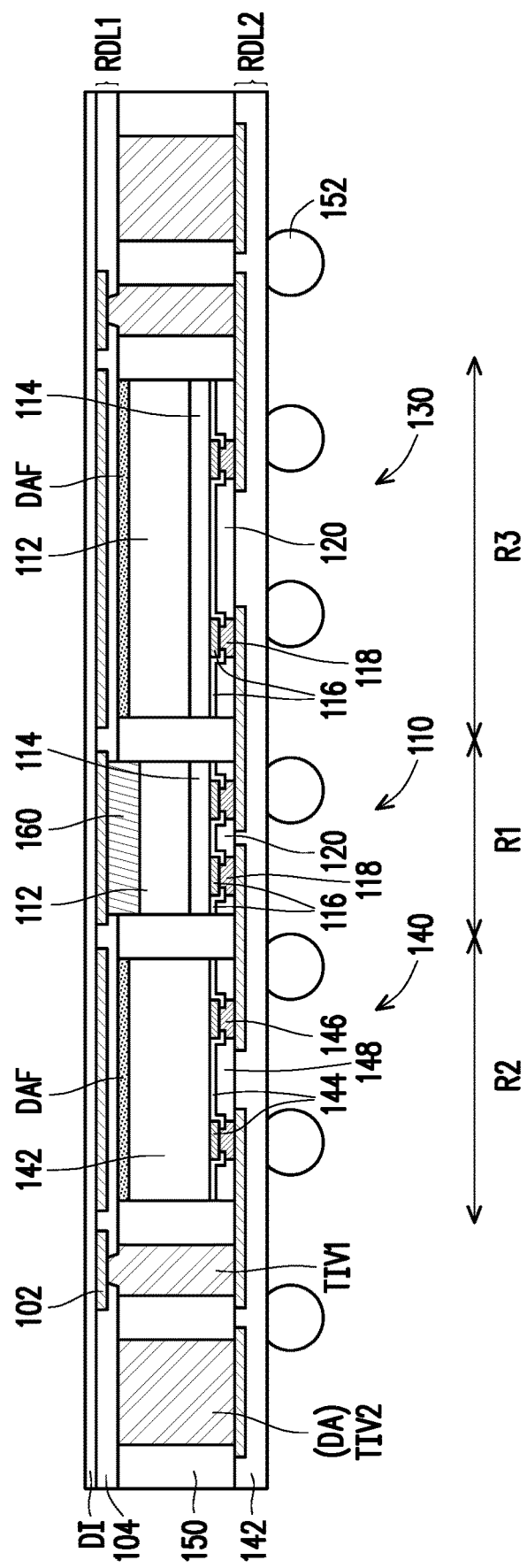

Referring to FIG. 3D, the carrier C is de-bonded. In some embodiments, the carrier C with the first die 110, the second die 130, the dummy die 140, the molding layer 150, the first and second redistribution layer structures RDL1 and RDL2 is turned over, the de-bonding layer DB is decomposed under heat of light, and the carrier C is then released from the backsides or first sides of the first die 110, the second die 130 and the dummy die 140.

Figure 3E:
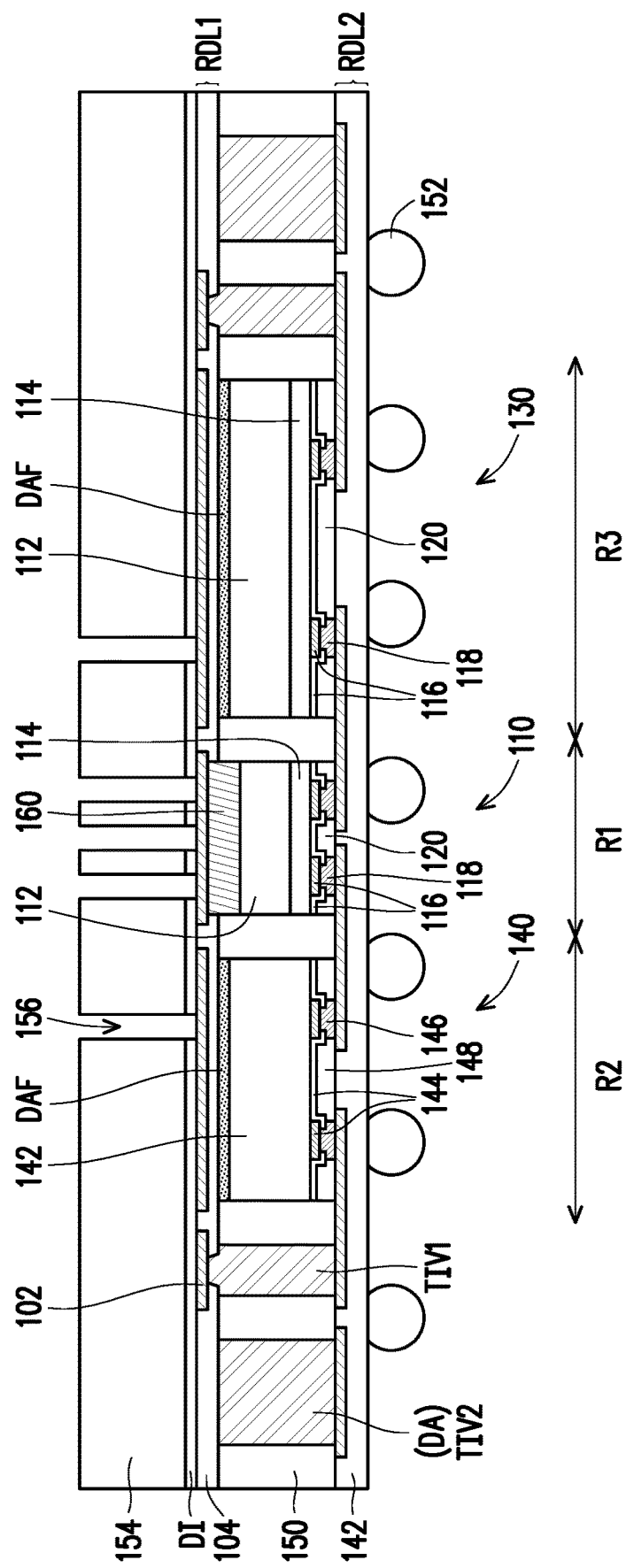

Referring to FIG. 3E, an insulating layer 154 is formed over the backsides or first sides of the first die 110, the second die 130 and the dummy die 140. Then, a plurality of openings 156 are formed in the insulating layer 154.

Figure 3F:
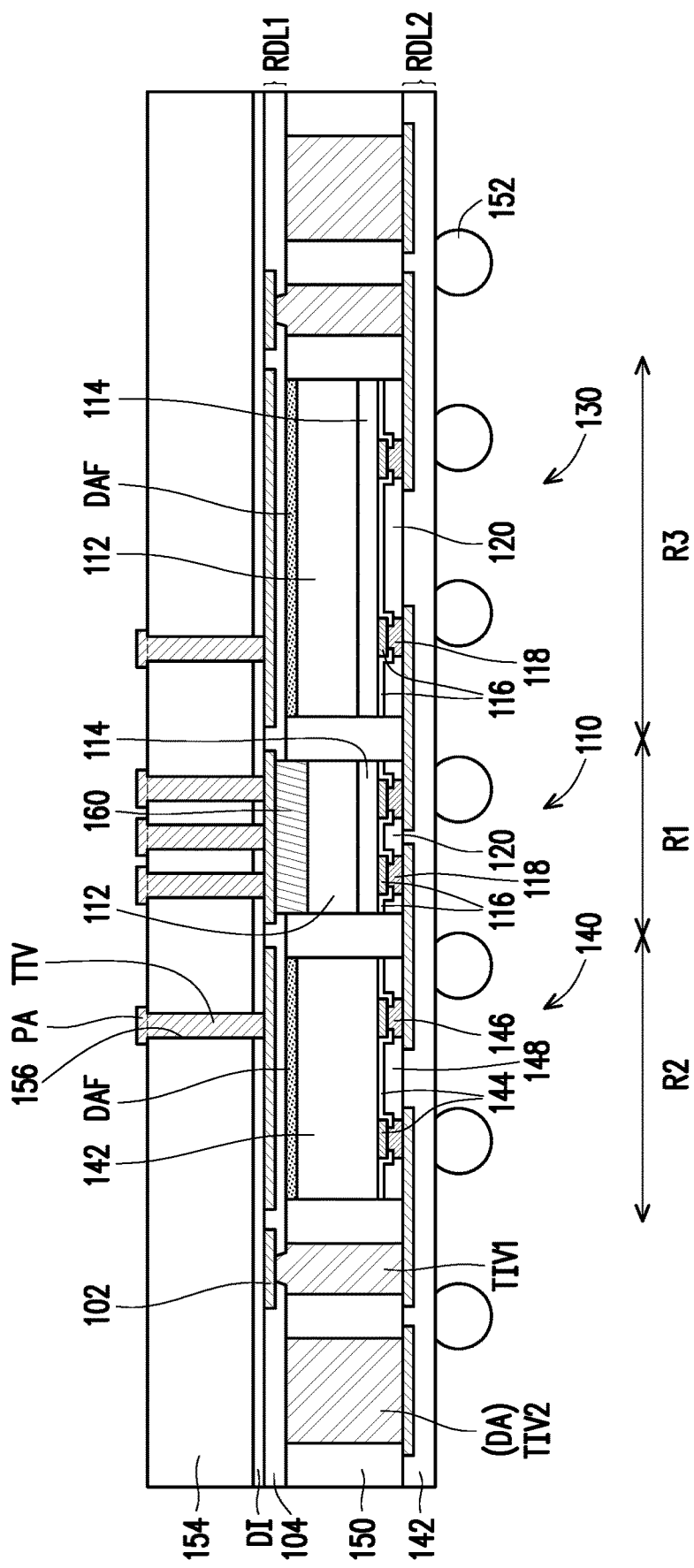

Referring to FIG. 3F, a plurality of thermal through vias TTV are formed in the openings 156 of the insulating layer 154. In some embodiments, the thermal through vias TTV in the first region R1 are electrically connected to the first die 110 through the first redistribution layer structure RDL1 and the conductive paste 160.

In some embodiments, in addition to formation of the thermal through vias and the dummy die, the thermal through vias are designed to electrically connect to the first die through the conductive paste. Accordingly, the heat may be dissipated more efficiently, and the temperature of the first die may be significantly decreased.

Figure 4:
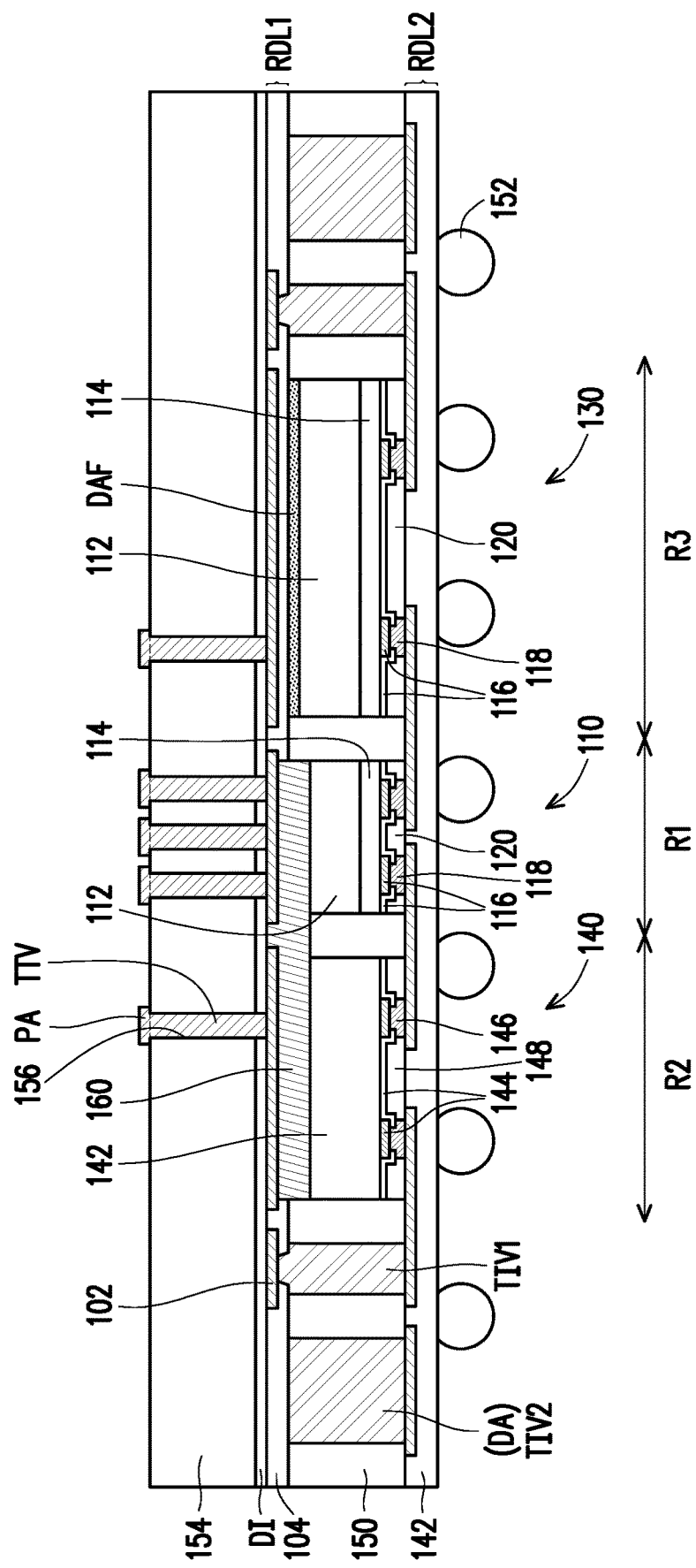
FIG. 4 is a schematic cross sectional view illustrating a semiconductor package in accordance with some embodiments.

In some embodiments, the conductive paste 160 is only formed on the backside of the first die 110. However, the present disclosure is not limited thereto. In alternative embodiments, as shown in FIG. 4, the conductive paste 160 may be continuously formed on the backsides of the first die 110 and the dummy die 140. In this case, the first die 110 and the dummy die 140 are electrically connected to each other through the conductive paste 160. Accordingly, the heat may be dissipated more efficiently, and the temperature of the first die may be significantly decreased.

Figure 5:
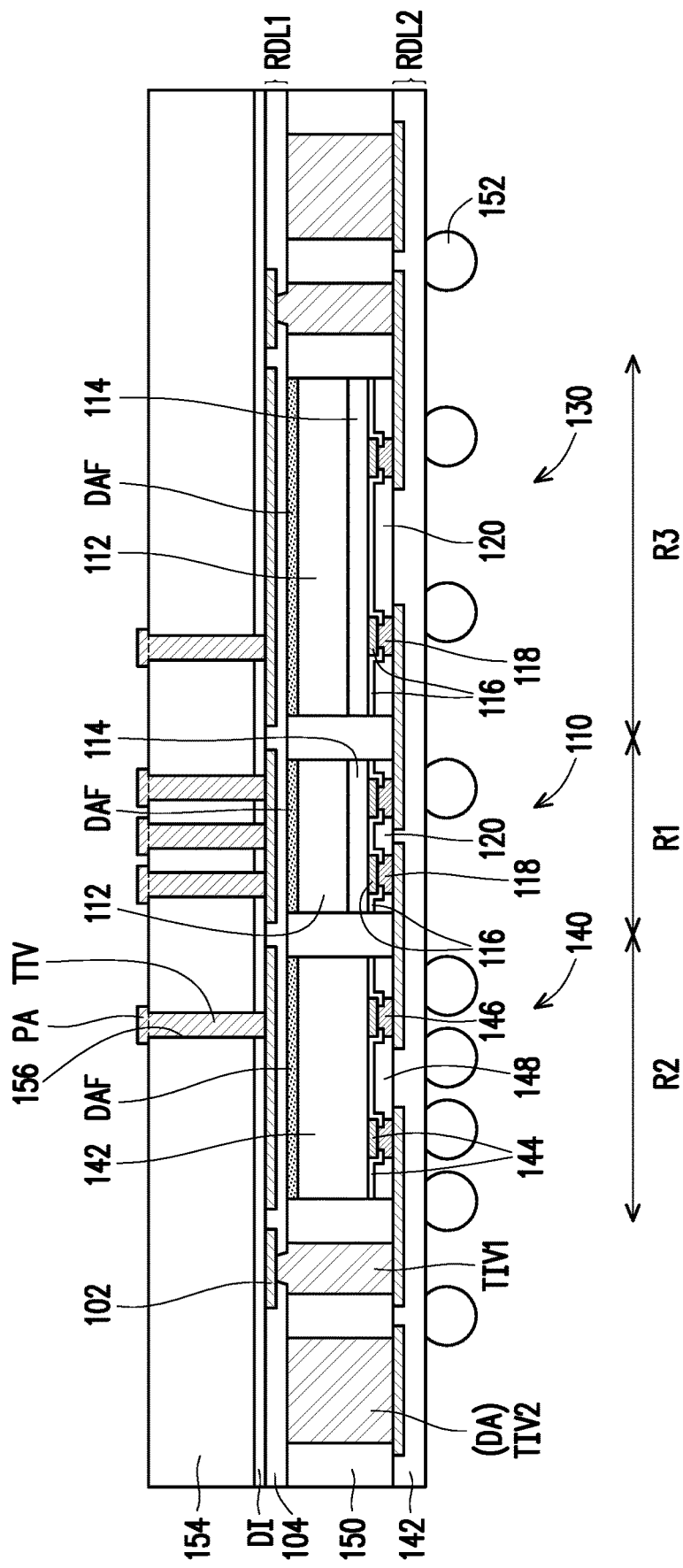
FIG. 5 is a schematic cross sectional view illustrating a semiconductor package in accordance with some embodiments.

FIG. 5 is a schematic cross sectional view illustrating a semiconductor package in accordance with some embodiments. In FIG. 5, a semiconductor package similar to the structure as shown in FIG. 1F is described, except that the density of connectors is different in different regions. Referring to FIG. 5, in some embodiments, the density of connectors 152 above a dummy die 140 is larger than the density of the connectors 152 above other elements such as a first die 110 or a second die 130. In other words, compared with substantially the same density of the connectors 152 in all regions in FIG. 1F, the density of the connectors 152 in a second region R2 is larger than the density of the connectors 152 in other regions such as the second region R2 or the third region R3. In the case that the connectors 152 have substantially the same size, the density of the connectors 152 in the first region R1 is defined as the number of the connectors 152 in the first region R1 divided by an area of the first region R1, the density of the connectors 152 in the second region R2 is equal to the number of the connectors 152 in the second region R2 divided by an area of the second region R2, and the density of the connectors 152 in the third region R3 is equal to the number of the connectors 152 in the third region R3 divided by an area of the third region R3. In some embodiments, the area of the first region R1 may be an area of a top surface of the first die 110, the area of the second region R2 may be an area of a top surface of the dummy die 140, and the area of the third region R2 may be an area of a top surface of the second die 130. In some embodiments, the connectors 152 in the second region R2 are electrically connected to the dummy die 140. In some embodiments, the dummy die 140 may be electrically connected to the first die 110. In some embodiments, in addition to formation of the thermal through vias and the dummy die, the connectors disposed above the dummy die are designed to increase the thermal capacitance. Accordingly, the heat may be dissipated more efficiently, and the temperature of the first die may be significantly decreased.

According to some embodiments, a semiconductor package includes a first die, a dummy die, a first redistribution layer structure, an insulating layer and an insulating layer. The dummy die is disposed aside the first die. The first redistribution layer structure is electrically connected to the first die and having connectors thereover. The insulating layer is disposed over the first die and the dummy die and opposite to the first redistribution layer structure. The insulating layer penetrates through the insulating layer.

According to some embodiments, a semiconductor package includes a first die, an insulating layer, thermal through vias and a conductive paste. The insulating layer is disposed over the first die. The thermal through vias penetrate through the insulating layer over the first die. The conductive paste is in direct contact with the first die and between the first die and a corresponding one of the thermal through vias. The corresponding one of the thermal through vias is electrically connected to the first die through the conductive paste.

According to some embodiments, a method of forming a semiconductor package includes the following steps. A first die and a dummy die are provided. A first redistribution layer structure is formed over the first die to electrically connect the first die. The connectors are formed over the first redistribution layer structure. An insulating layer is formed over the first die and the dummy die, wherein the insulating layer is disposed opposite to the redistribution layer structure. Thermal through vias are formed to penetrates through the insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a first die;
a dummy die aside the first die;
a redistribution layer structure electrically connected to the first die and having connectors therebelow;
an insulating layer over the first die and the dummy die, and opposite to the redistribution layer structure with respect to the first die; and
thermal through vias penetrating through the insulating layer.

2. The semiconductor package as claimed in claim 1, wherein the dummy die is electrically connected to the first die.

3. The semiconductor package as claimed in claim 1, wherein the thermal through vias are electrically connected to the redistribution layer structure.

4. The semiconductor package as claimed in claim 1, wherein the connectors are bumps or balls.

5. The semiconductor package as claimed in claim 1, further comprising other redistribution layer structure disposed between the insulating layer and the first die and the dummy die, wherein the thermal through vias are electrically connected to the redistribution layer structure through the other redistribution layer structure.

6. The semiconductor package as claimed in claim 1, wherein the first die is disposed in a first region, the dummy die is disposed in a second region, a density of the thermal through vias in the first region is equal to the number of the thermal through vias in the first region divided by an area of the first region, a density of the thermal through vias in the second region is equal to the number of the thermal through vias in the second region divided by an area of the second region, and the density of the thermal through vias in the first region is larger than the density of the thermal through vias in the second region.

7. The semiconductor package as claimed in claim 1, wherein the first die is disposed in a first region, the dummy die is disposed in a second region, a density of the connectors in the first region is equal to the number of the connectors in the first region divided by an area of the first region, a density of the connectors in the second region is equal to the number of the connectors in the second region divided by an area of the second region, and the density of the connectors in the second region is larger than the density of the connectors in the first region.

8. The semiconductor package as claimed in claim 1, wherein the first die is a power amplifier die.

9. The semiconductor package as claimed in claim 1, further comprising patch antennas electrically connected to the thermal through vias respectively.

10. A semiconductor package, comprising:
a first die;
an insulating layer over the first die;
thermal through vias penetrating through the insulating layer over the first die; and
a conductive paste in direct contact with the first die and between the first die and a corresponding one of the thermal through vias,
wherein the corresponding one of the thermal through vias is electrically connected to the first die through the conductive paste.

11. The semiconductor package as claimed in claim 10, further comprising a dummy die aside the first die.

12. The semiconductor package as claimed in claim 11, wherein the conductive paste is further in direct contact with the dummy die.

13. The semiconductor package as claimed in claim 11, wherein the dummy die is electrically connected to the first die.

14. The semiconductor package as claimed in claim 10, further comprising a redistribution layer structure electrically connected to the first die and having connectors therebelow, wherein the redistribution layer structure and the thermal through vias are disposed at opposite sides of the first die.

15. The semiconductor package as claimed in claim 14, wherein the connectors are bumps or balls.

16. A method of forming a semiconductor package, comprising:
providing a first die and a dummy die aside the first die;
forming a redistribution layer structure over the first die to electrically connect the first die;
forming connectors over the redistribution layer structure;
forming an insulating layer, wherein the insulating layer is disposed opposite to the redistribution layer structure with respect to the first die; and
forming thermal through vias penetrating through the insulating layer.

17. The method as claimed in claim 16, wherein the thermal through vias are electrically connected to the first die.

18. The method as claimed in claim 16, further comprising forming a conductive paste between the thermal through vias and the first die.

19. The method as claimed in claim 18, further comprising forming other redistribution layer structure between the conductive paste and the thermal through vias, wherein the thermal through vias are electrically connected to the first die through the other redistribution layer structure.

20. The method as claimed in claim 16, further comprising forming a conductive paste between the thermal through vias and the first die and between the thermal through vias and the dummy die.

* * * * *